(12) United States Patent
Kim et al.

(10) Patent No.: US 9,875,710 B2
(45) Date of Patent: Jan. 23, 2018

(54) GATE DRIVING CIRCUIT WITH REDUCED VOLTAGE TO MITIGATE TRANSISTOR DETERIORATION

(71) Applicant: Samsung Display Co., Ltd., Yongin-si (KR)

(72) Inventors: JongHee Kim, Yongin-si (KR); Cholho Kim, Suwon-si (KR); Jaekeun Lim, Suwon-si (KR); Youngwan Seo, Suwon-si (KR); Chongchul Chai, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 146 days.

(21) Appl. No.: 14/966,469

(22) Filed: Dec. 11, 2015

(65) Prior Publication Data
US 2016/0203783 A1    Jul. 14, 2016

(30) Foreign Application Priority Data

Jan. 14, 2015 (KR) .................. 10-2015-0006806

(51) Int. Cl.
| | | |
|---|---|---|
| *G09G 3/36* | (2006.01) | |
| *G09F 1/04* | (2006.01) | |
| *G11C 19/28* | (2006.01) | |
| *G06F 1/04* | (2006.01) | |

(52) U.S. Cl.
CPC ............ *G09G 3/3677* (2013.01); *G06F 1/04* (2013.01); *G09G 3/3648* (2013.01); *G09G 3/3696* (2013.01); *G11C 19/287* (2013.01); *G09G 2300/0413* (2013.01); *G09G 2300/08* (2013.01); *G09G 2310/0243* (2013.01); (Continued)

(58) Field of Classification Search
CPC .. G09G 3/3677; G09G 3/3648; G09G 3/3696; G09G 2300/0413; G09G 2330/04; G09G 2300/08; G09G 2310/08; G09G 2320/041; G09G 2310/0243; G09G 2330/08; G11C 19/287; G02F 1/13; G06F 1/04
See application file for complete search history.

(56) References Cited

U.S. PATENT DOCUMENTS

| | | |
|---|---|---|
| 7,825,888 B2 | 11/2010 | Tobita et al. |
| 9,087,468 B2 | 7/2015 | Yoon et al. |
| 2013/0249884 A1 | 9/2013 | Kim et al. |

(Continued)

FOREIGN PATENT DOCUMENTS

| | | |
|---|---|---|
| EP | 2 713 361 | 4/2014 |
| JP | 2011-191754 | 9/2011 |

(Continued)

*Primary Examiner* — Larry Sternbane
(74) *Attorney, Agent, or Firm* — H.C. Park & Associates, PLC

(57) ABSTRACT

A gate driving circuit includes first and second driving stages respectively driving first and second gate lines of a display panel. The first driving stage includes output transistors, a first control transistor controlling an electric potential of a control node in response to a signal provided from the second driving stage through an input terminal before a first gate signal is output, and a second control transistor applying a first carry signal to the input electrode of the first control transistor while the first gate signal is output.

20 Claims, 8 Drawing Sheets

(52) U.S. Cl.
CPC ... *G09G 2310/08* (2013.01); *G09G 2320/041* (2013.01); *G09G 2330/04* (2013.01); *G09G 2330/08* (2013.01)

(56) References Cited

U.S. PATENT DOCUMENTS

| | | |
|---|---|---|
| 2014/0049458 A1 | 2/2014 | Cho et al. |
| 2014/0092078 A1 | 4/2014 | Yoon et al. |
| 2014/0218347 A1 | 8/2014 | Lee et al. |
| 2015/0042383 A1 | 2/2015 | Kwon et al. |
| 2015/0042547 A1 | 2/2015 | Kwon et al. |
| 2015/0042638 A1 | 2/2015 | Kwon et al. |
| 2015/0042689 A1 | 2/2015 | Kim et al. |
| 2015/0077407 A1 | 3/2015 | Kim et al. |
| 2015/0263722 A1 | 9/2015 | Kim et al. |
| 2015/0287376 A1* | 10/2015 | Lim .................... G09G 3/3677 345/92 |
| 2015/0287392 A1 | 10/2015 | Kim et al. |

FOREIGN PATENT DOCUMENTS

| | | |
|---|---|---|
| JP | 2014-071452 | 4/2014 |
| KR | 10-2013-0028274 | 3/2013 |
| KR | 10-2013-0129124 | 11/2013 |
| KR | 10-2014-0024571 | 3/2014 |
| KR | 10-2014-0099025 | 8/2014 |
| KR | 10-2015-0017810 | 2/2015 |
| KR | 10-2015-0018969 | 2/2015 |
| KR | 10-2015-0018970 | 2/2015 |
| KR | 10-2015-0019098 | 2/2015 |
| KR | 10-2015-0031899 | 3/2015 |
| KR | 10-2015-0086771 | 7/2015 |
| KR | 10-2015-0086973 | 7/2015 |

\* cited by examiner

GATE DRIVING CIRCUIT WITH REDUCED VOLTAGE TO MITIGATE TRANSISTOR DETERIORATION

CROSS REFERENCE TO RELATED APPLICATION

This application claims priority from and the benefit of Korean Patent Application No. 10-2015-0006806, filed on Jan. 14, 2015, which is hereby incorporated by reference for all purposes as if fully set forth herein.

BACKGROUND

Field

Exemplary embodiments relate to a gate driving circuit. More particularly, the present disclosure relates to a gate driving circuit directly integrated on a display panel.

Discussion of the Background

A display device typically includes gate lines, data lines, and pixels. Each of the pixels may be connected to a corresponding gate line of the gate lines and a corresponding data line of the data lines. The display device typically includes a gate driving circuit to control the gate lines and a data driving circuit to control the data lines. The gate driving circuit may apply gate signals to the gate lines, respectively, and a data driving circuit may apply data signals to the data lines, respectively.

The gate driving circuit typically includes a shift register including driving stage circuits, e.g., driving stages. Each driving stage may output the gate signal corresponding to the gate line. Each driving stage may include transistors connected to each other.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a gate driving circuit capable of preventing transistors thereof from burning and deteriorating.

Additional aspects will be set forth in the detailed description which follows, and, in part, will be apparent from the disclosure, or may be learned by practice of the inventive concept.

According to exemplary embodiments, a gate driving circuit includes a first driving stage and a second driving stage, which respectively drive first and second gate lines of a display panel. The first driving stage includes a first output transistor including a control electrode connected to a control node, an input electrode receiving a clock signal, and an output electrode outputting a first gate signal generated on the basis of the clock signal, a second output transistor including a control electrode connected to the control node, an input electrode receiving the clock signal, and an output electrode outputting a first carry signal generated on the basis of the clock signal, a first control transistor controlling an electric potential of the control node in response to a signal provided from the second driving stage through an input terminal before the first gate signal is output, and a second control transistor applying the first carry signal to the input electrode of the first control transistor while the first gate signal is output.

According to exemplary embodiments, a gate driving circuit includes a first driving stage and a second driving stage, which respectively drive the first and second gate lines of a display panel. The first driving stage includes an output component outputting a first gate signal and a first carry signal, which are generated on the basis of a clock signal, in response to a voltage of a control node, a control component controlling the voltage of the control node on the basis of a second carry signal output from the second driving stage, an inverter component outputting a switching signal generated on the basis of the clock signal, and a pull-down component lowering the first gate signal and the first carry signal, which are output from the output component, after the first gate signal is output. The control component includes a first control transistor controlling the electric potential of the control node in response to the second carry signal and a second control transistor applying the second carry signal to an input electrode of the first control transistor in response to the first carry signal.

According to exemplary embodiments, a gate driving circuit includes an (i−1)th driving stage and an i-th driving stage respectively applying an (i−1)th gate signal and an i-th gate signal to an (i−1)th gate line and an i-th gate line. The i-th driving stage includes a first output transistor including a control electrode connected to a control node, an input electrode receiving a clock signal, and an output electrode outputting the i-th gate signal, a second output transistor including a control electrode connected to the control node, an input electrode receiving the clock signal, and an output electrode outputting an i-th carry signal, a first control transistor outputting an (i−1)th carry signal provided from the second driving stage to the control node, and a second control transistor outputting the i-th carry signal to the input electrode of the first control transistor.

According to the above, the carry signal output from the previous driving stage is applied to the control node through the first control transistor. The control node is connected to the control nodes of the output transistors. The carry signal is applied to the output node, to which the input and control electrodes of the first control transistor are connected, when the gate signal of the driving stage, from which the carry signal is output, is output. Therefore, the drain-source voltage of the first control transistor is reduced when the gate signal of the driving stage including the first control transistor is output. Thus, the first control transistor may be prevented from burning and deteriorating.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
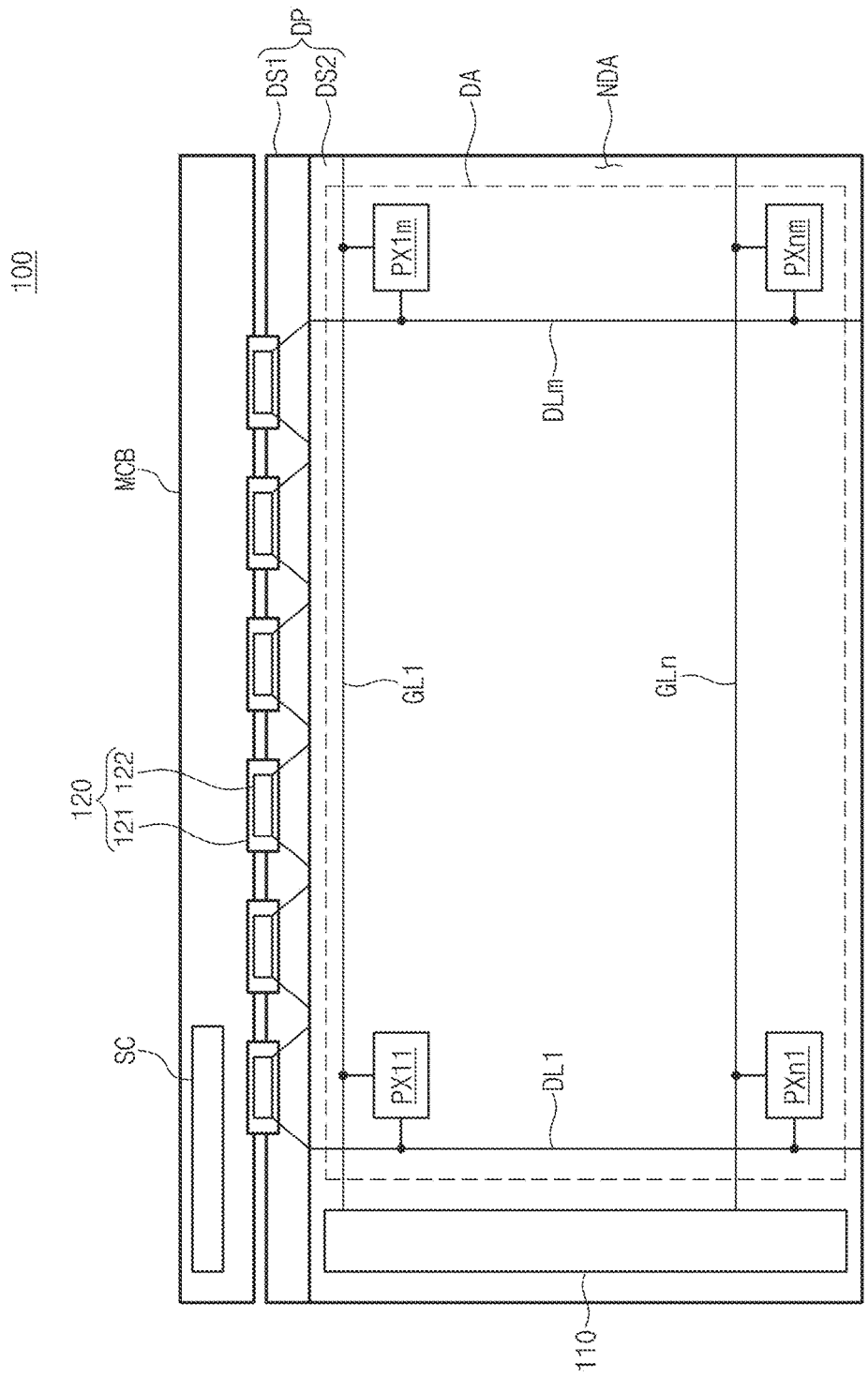
FIG. 1 is a plan view showing a display device according to an exemplary embodiment of the present disclosure.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. May be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, the present disclosure will be explained in detail with reference to the accompanying drawings.

Figure 2:
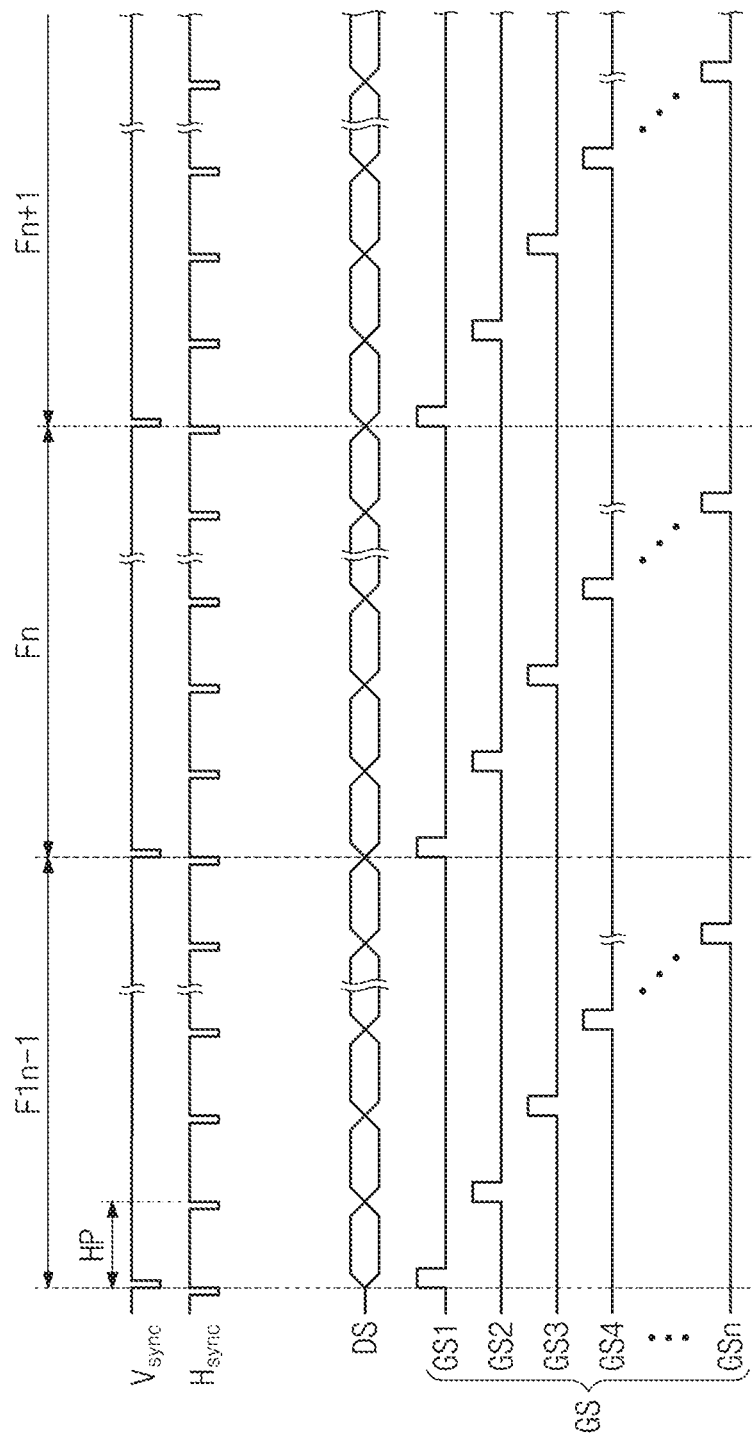
FIG. 2 is a timing diagram showing signals used in a display device according to an exemplary embodiment of the present disclosure.

Referring to FIGS. 1 and 2, display device 100 includes display panel DP, gate driving circuit 110, and data driving circuit 120.

Display panel DP may be one of various types of display panels, such as liquid crystal, organic light emitting, electrophoretic, electrowetting, etc.

In the present exemplary embodiment, a liquid crystal display panel will be described as display panel DP, but display panel DP should not be limited to a liquid crystal display panel. The liquid crystal display device including the liquid crystal display panel may further include a polarizer (not shown) and a backlight unit (not shown).

Display panel DP may include first substrate DS1, second substrate DS2 spaced apart from the first substrate DS1, and a liquid crystal layer (not shown) disposed between first and second substrates DS1 and DS2. Display panel DP includes display area DA in which a plurality of pixels PX11 to PXnm is disposed and non-display area NDA surrounding the display area DA.

Display panel DP includes a plurality of gate lines GL1 to GLn and a plurality of data lines DL1 to DLm, which are disposed on first base substrate DS1. Gate lines GL1 to GLn cross data lines DL1 to DLm. Gate lines GL1 to GLn are connected to gate driving circuit 110. Data lines DL1 to DLm are connected to data driving circuit 120.

Each of pixels PX11 to PXnm is connected to a corresponding gate line of gate lines GL1 to GLn and a corresponding data line of data lines DL1 to DLm. Pixels PX11 to PXnm may be grouped into a plurality of groups according to colors displayed thereby. Each of pixels PX11 to PXnm may display one of the primary colors. The primary colors may include, but are not limited to, red, green, blue, and white. For example, the primary colors may include other various colors, yellow, cyan, magenta, etc.

Although not shown in figures, display panel DP may include a dummy gate line disposed in non-display area NDA of first substrate DS1. The dummy gate line is not connected to pixels PX11 to PXnm and is connected to gate driving circuit 110.

Gate driving circuit 110 and data driving circuit 120 may receive control signals from signal controller SC, e.g., a timing controller. Signal controller SC is mounted on main circuit board MCB. Signal controller SC may receive image signals and control signals from an external graphic controller (not shown). The control signals include vertical synchronization signal Vsync, horizontal synchronization signal Hsync, a data enable signal, and clock signals.

Vertical synchronization signal Vsync serves as a signal to distinguish frame periods Fn−1, Fn, and Fn+1. Horizontal synchronization signal Hsync serves as a row distinction signal to distinguish horizontal periods HP. Data enable signal DE is maintained at a high level during the period in which data is output to indicate a data output period. The clock signals may toggle signals at predetermined periods.

Gate driving circuit 110 generates gate signals GS1 to GSn in response to the control signal (hereinafter, referred to as a gate control signal) provided from signal controller SC during frame periods Fn−1, Fn, and Fn+1 and applies gate signals GS1 to GSn to gate lines GL1 to GLn. Gate signals GS1 to GSn are sequentially output to correspond to horizontal periods HP. Gate driving circuit 110 may be simultaneously formed with pixels PX11 to PXnm through a thin film deposition process. For instance, gate driving circuit 110 may be mounted on non-display area NDA in an amorphous silicon TFT gate driver circuit (ASG) form or an oxide semiconductor TFT gate driver circuit (OSG) form.

In an exemplary embodiment, display device 100 may include two or more gate driving circuits. One gate driving circuit of the two gate driving circuits is connected to the left ends of gate lines GL1 to GLn and the other gate driving circuit of the two gate driving circuits is connected to right ends of gate lines GL1 to GLn. One gate driving circuit of the two gate driving circuits is connected to odd-numbered gate lines of gate lines GL1 to GLn and the other gate driving circuit of the two gate driving circuits is connected to even-numbered gate lines of gate lines GL1 to GLn.

Data driving circuit 120 may generate grayscale voltages corresponding to the image data provided from signal controller SC in response to the control signal (hereinafter, referred to as a data signal) provided from signal controller SC. Data driving circuit 120 may apply the grayscale voltages to data lines DL1 to DLm as data voltages DS.

Data voltages DS include positive (+) data voltages having a positive polarity with respect to a common voltage and/or negative (−) data voltages having a negative polarity with respect to the common voltage. A portion of the data voltages applied to data lines DL1 to DLm during each horizontal period HP has positive polarity and the other portion of the data voltages applied to data lines DL1 to DLm during each horizontal period HP has negative polarity. The polarity of data voltages DS is inverted according to frame periods Fn−1, Fn, and Fn+1 to prevent the liquid crystal from burning and deteriorating. Data driving circuit 120 generates data voltages inverted in the unit of frame period in response to an inversion signal.

Data driving circuit 120 includes driving chip 122 and flexible circuit board 121 on which a driving chip 122 is mounted. Each driving chip 122 and flexible circuit board 121 may be provided in plurality. Flexible circuit board 121 electrically connects main circuit board MCB and first substrate DS1. Each driving chip 122 drives a corresponding data line of data lines DL1 to DLm. Each driving chip 122 applies a corresponding data voltage of the data voltages to a corresponding data line of data lines DL1 to DLm. Alternatively, each driving chip 122 may drive at least two data lines of data lines DL1 to DLm.

In FIG. 1, data driving circuit 120 is provided in tape carrier package (TCP) form, but it should not be limited thereto or thereby. That is, data driving circuit 120 may be mounted on first substrate DS1 in, for example, a chip-on-glass (COG) form to correspond to non-display area NDA.

Figure 3:
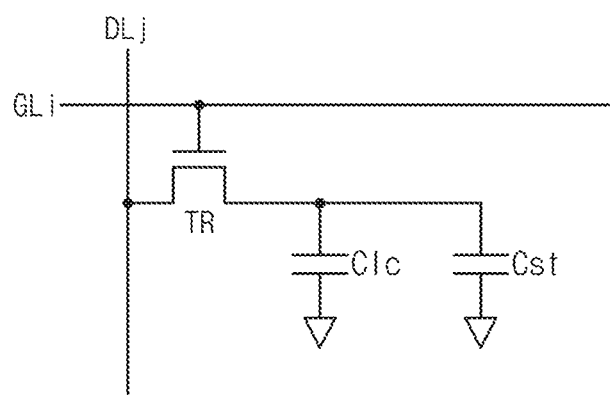
FIG. 3 is an equivalent circuit diagram showing one pixel of the pixels shown in FIG. 1.
Figure 4:
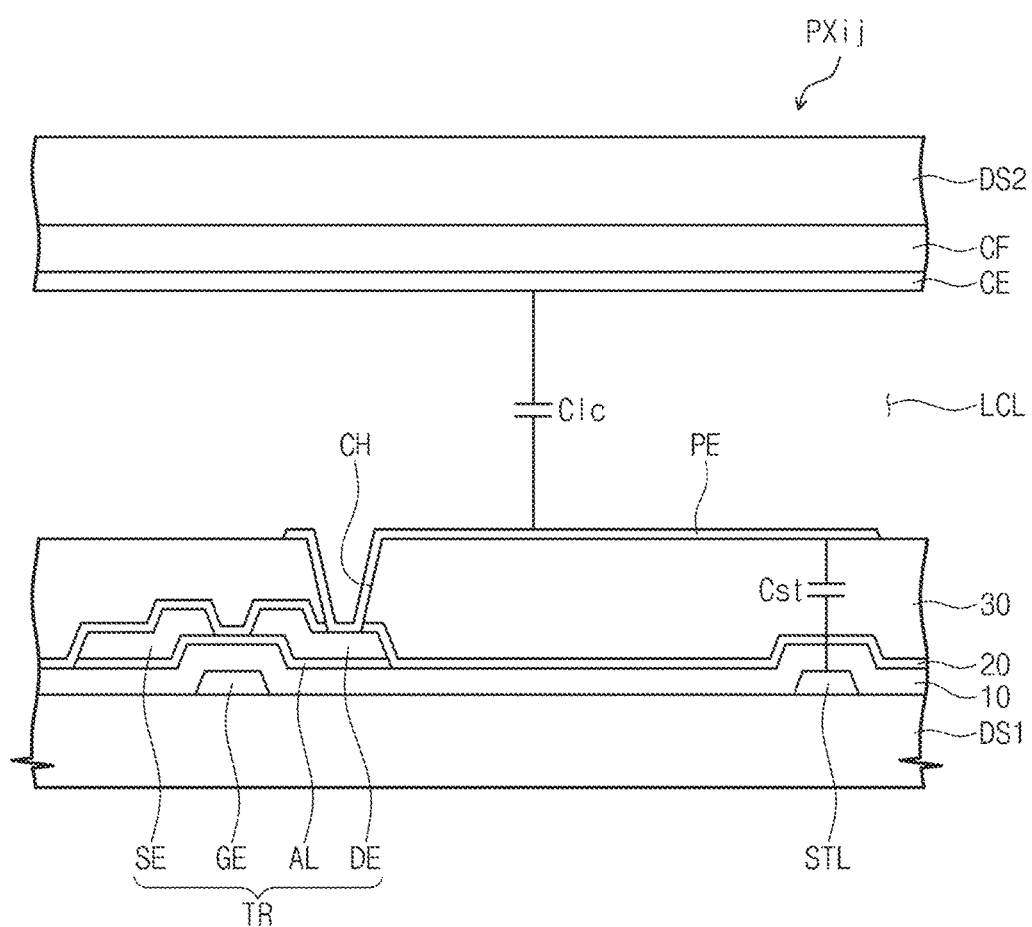
FIG. 4 is a cross-sectional view showing one pixel of the pixels shown in FIG. 1.

Referring to FIGS. 3 and 4, pixel PXij includes pixel thin film transistor TR (hereinafter, referred to as a pixel transistor), liquid crystal capacitor Clc, and storage capacitor Cst. Hereinafter, the term "transistor" refers to a thin film transistor. Although not shown in the drawings, in certain exemplary embodiments, storage capacitor Cst may be omitted.

Pixel transistor TR is electrically connected to an i-th gate line GLi and a j-th data line DLj. Pixel transistor TR includes a control electrode electrically connected to the i-th gate line GLi and an input electrode electrically connected to the j-th data line DLj. Pixel transistor TR outputs a pixel voltage corresponding to the data signal provided from the j-th data line DLj in response to the gate signal provided from the i-th gate line GLi.

Liquid crystal capacitor Clc is electrically connected to an output electrode of pixel transistor TR and charged with the pixel voltage output from pixel transistor TR. Alignment of liquid crystal directors included in liquid crystal layer LCL may be changed in accordance with an amount of electric charge charged in liquid crystal capacitor Clc. A light incident to liquid crystal layer LCL may transmit through or may be blocked according to the alignment of the liquid crystal directors.

Storage capacitor Cst is connected to liquid crystal capacitor Clc in parallel. Storage capacitor Cst may maintain the alignment of the liquid crystal directors for a predetermined period.

Referring to FIG. 4, pixel transistor TR includes control electrode GE connected to the i-th gate line GLi, active part AL overlapped with control electrode GE, input electrode SE connected to the j-th data line DLj, and output electrode DE disposed to be spaced apart from input electrode SE.

Liquid crystal capacitor Clc includes pixel electrode PE and common electrode CE. Storage capacitor Cst includes pixel electrode PE and a portion of storage line STL.

I-th gate line GLi and storage line STL are disposed on an upper surface of first substrate DS1. Control electrode GE may be branched from i-th gate line GLi. I-th gate line GLi and storage line STL include a metal material, such as aluminum (Al), silver (Ag), copper (Cu), molybdenum (Mo), chromium (Cr), tantalum (Ta), titanium (Ti), and/or an alloy thereof. Each i-th gate line GLi and storage line STL may have a multi-layer structure of a titanium layer and a copper layer.

First insulating layer 10 is disposed on first substrate DS1 and covers control electrode GE and storage line STL. First insulating layer 10 may include at least one of an inorganic material and an organic material. First insulating layer 10 may be, therefore, an organic or an inorganic layer. For example, first insulating layer 10 may have a multi-layer structure including a silicon nitride layer and a silicon oxide layer.

Active part AL is disposed on the first insulating layer 10 and overlaps the control electrode GE. Active part AL may include semiconductor layer SCL (not shown) and ohmic contact layer OCL (not shown). Semiconductor layer SCL may be disposed on first insulating layer 10 and ohmic contact layer OCL may be disposed on semiconductor layer SCL.

Semiconductor layer SCL may include, for example, amorphous silicon or polysilicon, and may include a metal oxide semiconductor. Ohmic contact layer OCL may be more highly doped with a dopant than semiconductor layer SCL. Ohmic contact layer OCL may include two portions spaced apart from each other. In an exemplary embodiment, ohmic contact layer OCL may be integrally formed in a single unitary and individual unit.

Output electrode DE and input electrode SE are disposed on active part AL. Output electrode DE and input electrode SE are spaced apart from each other. Each output electrode DE and input electrode SE is partially overlapped with control electrode GE.

Output electrode DE and input electrode SE may be disposed on ohmic contact layer OCL. When viewed in a plan view, output electrode DE may be completely overlapped with one portion of ohmic contact layer OCL and input electrode SE may be completely overlapped with the other portion of ohmic contact layer OCL.

Second insulating layer 20 is disposed on first insulating layer 10 to cover active part AL, output electrode DE, and input electrode SE. Second insulating layer 20 may include an inorganic or organic material. Second insulating layer 20 may be an organic or inorganic layer. Second insulating layer 20 may have a multi-layer structure including a silicon nitride layer and a silicon oxide layer.

FIG. 1 shows pixel transistor TR having a staggered structure, but the structure of pixel transistor TR should not be limited to the staggered structure. For example, pixel transistor TR may have a planar structure.

Third insulating layer 30 is disposed on second insulating layer 20. Third insulating layer 30 may provide an even surface. Third insulating layer 30 may include an organic material.

Pixel electrode PE is disposed on third insulating layer 30. Pixel electrode PE is connected to output electrode DE through contact hole CH which is formed through second and third insulating layers 20 and 30. An alignment layer (not shown) may be disposed on third insulating layer 20 to cover the pixel electrode PE.

Color filter layer CF is disposed on a surface of second substrate DS2. Common electrode CE is disposed on color filter layer CF. Common electrode CE may be applied with a common voltage. The common voltage may have a level different from that of the pixel voltage. An alignment layer (not shown) may be disposed on common electrode CE to cover common electrode CE. Another insulating layer may be disposed between color filter layer CF and common electrode CE.

Pixel electrode PE and common electrode CE, which face each other such that liquid crystal layer LCL is disposed between pixel electrode PE and common electrode CE, form liquid crystal capacitor Clc. Pixel electrode PE and a portion of storage line STL, which face each other such that first, second, and third insulating layers 10, 20, and 30 are disposed between pixel electrode PE and the portion of the storage line STL, form storage capacitor Cst. Storage line STL may be applied with a storage voltage having a different voltage from the pixel voltage. However, in some exemplary embodiments, the storage voltage may have the same voltage as that of the common voltage.

Exemplary embodiments are not limited to the structure described above. For example, different from the structure of pixel PXij shown in FIG. 3, at least one color filter layer CF and common electrode CE may be disposed on first substrate DS1. The liquid crystal display panel according to exemplary embodiments may, therefore, include a vertical alignment (VA) mode pixel, a patterned vertical alignment (PVA) mode pixel, an in-plane switching (IPS) mode pixel, a fringe-field switching (FFS) mode pixel, or a plane-to-line switching (PLS) mode pixel.

Figure 5:
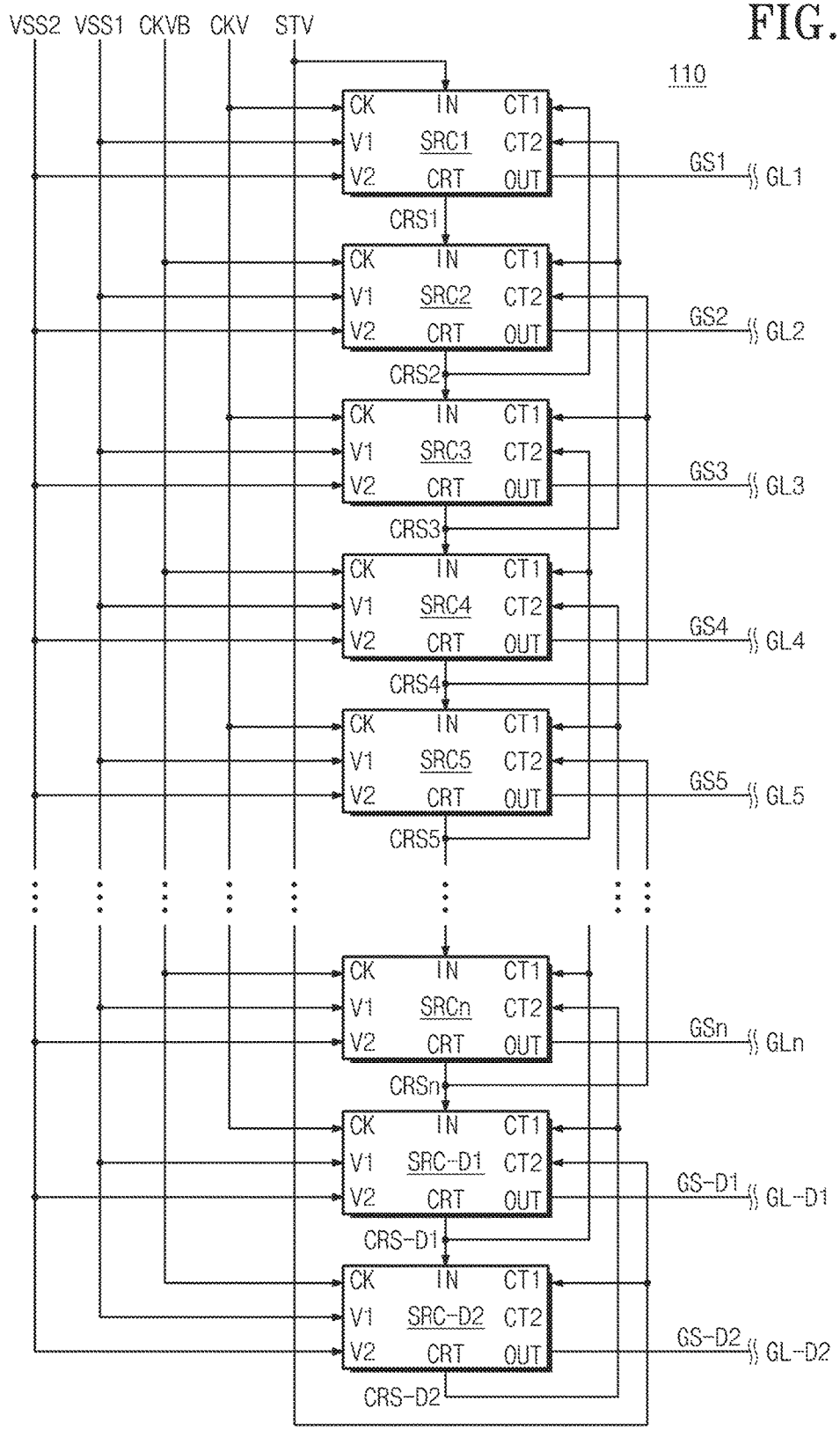
FIG. 5 is a block diagram showing a gate driving circuit shown in FIG. 1.

Referring to FIG. 5, gate driving circuit 110 includes a plurality of driving stages SRC1 to SRCn connected to each other in sequence. Hereinafter, for the convenience of explanation, first driving stage SRC1 corresponds to first driving stage of driving stages SRC1 to SRCn and first to n-th driving stages are sequentially connected to each other in series, but they should not be limited thereto or thereby.

Driving stages SRC1 to SRCn are respectively connected to gate lines GL1 to GLn. Driving stages SRC1 to SRCn apply the gate signals to gate lines GL1 to GLn, respectively. As shown in FIG. 5, gate lines connected to driving stages SRC1 to SRCn may be odd-numbered gate lines and even-numbered gate lines among gate lines GL1 to gGLn.

Gate driving circuit 110 may further include dummy stages SRC-D1 and SRC-D2 connected to last driving stage SRCn among driving stages SRC1 to SRCn. Dummy stages SRC-D1 and SRC-D2 are connected to dummy gate lines GL-D1 and GL-D2. The number of the dummy stages SRC-D1 and SRC-D2 may be increased or decreased. When the number of dummy stages SRC-D1 and SRC-D2 is changed, the number of dummy gate lines GL-D1 and GL-D2 is changed. Dummy stages SRC-D1 and SRC-D2 may have substantially the same structure or a different structure from driving stages SRC1 to SRCn.

Each driving stages SRC1 to SRCn includes output terminal OUT, carry terminal CRT, input terminal IN, first control terminal CT1, second control terminal CT2, clock terminal CK, first voltage input terminal V1, and second voltage input terminal V2.

Output terminal OUT of each of driving stages SRC1 to SRCn is connected to a corresponding gate line of gate lines GL1 to gGLn. The gate signals GS1 to gGSn generated by driving stages SRC1 to SRCn are applied to gate lines GL1 to GLn through output terminals OUT.

Carry terminal CRT of each of driving stages SRC1 to SRCn is electrically connected to input terminal IN of a next driving stage following the corresponding driving stage. For instance, carry terminal CRT of a third driving stage SRC3 is electrically connected to input terminal IN of a fourth driving stage SRC4 directly following the third driving stage SRC3. The carry terminals CRT of driving stages SRC1 to SRCn outputs carry signals CRS1 to CRSn, respectively.

Input terminal IN of each of driving stages SRC1 to SRCn receives the carry signal CRS from a previous driving stage prior to the corresponding driving stage. For instance, input terminal IN of third driving stage SRC3 receives carry signal CRS2 (hereinafter, referred to as a second carry signal) output from second driving stage SRC2. Among driving stages SRC1 to SRCn, input terminal IN of first driving stage SRC1 receives start signal STV that starts an operation of gate driving circuit 110.

First and second control terminals CT1 and CT2 of each of driving stages SRC1 to SRCn receive the carry signals CRS1 to CRSn of driving stages SRC1 to SRCn. In detail, first control terminal CT1 of each of driving stages SRC1 to SRCn receives the carry signal CRS output from the next driving stage following the corresponding driving stage. For instance, first control terminal CT1 of third driving stage SRC3 receives fourth carry signal CRS4 output from fourth driving stage SRC4. Second control terminal CT2 of each of driving stages SRC1 to SRCn receives the carry signal output from the driving stage following the next driving stage following the corresponding driving stage. For instance, second control terminal CT2 of third driving stage SRC3 receives fifth carry signal CRS5 output from fifth driving stage SRC5. In exemplary embodiments, the number of the control terminals of each of driving stages SRC1 to SRCn may be increased or decreased.

Clock terminal CK of each of driving stages SRC1 to SRCn receives first clock signal CKV or second clock signal CKVB. Clock terminals CK of odd-numbered driving stages (i.e. SRC1, SRC3, SRC5, . . . ) among driving stages SRC1 to SRCn receive the first clock signal CKV. Clock terminals CK of the even-numbered driving stages (SRC2, SRC4, . . . SRCn) among driving stages SRC1 to SRCn receive the second clock signal CKVB. First and second clock signals CKV and CKVB may have different phases from each other. Second clock signal CKVB may be obtained by inverting first clock signal CKV.

First voltage input terminal V1 of each of driving stages SRC1 to SRCn receives first discharge voltage VSS1 and second voltage input terminal V2 of each of driving stages SRC1 to SRCn receives second discharge voltage VSS2. Second discharge voltage VSS2 may have a voltage level different from that of first discharge voltage VSS1. For example, second discharge voltage VSS2 may have a voltage level lower than that of first discharge voltage VSS1.

At least one of first and second control terminals CT1 and CT2 of dummy stages SRC-D1 and SRC-D2 receives start signal STV. For example, second control terminal CT2 of dummy stage SRC-D1 receives start signal STV and first control terminal CT1 of dummy stage SRC-D2 receives start signal STV.

In each of driving stages SRC1 to SRCn according to the present exemplary embodiment, one of output terminal OUT, input terminal IN, carry terminal CRT, first control terminal CT1, second control terminal CT2, clock terminal CK, first voltage input terminal V1, and second voltage input terminal V2 may be omitted, or another terminal is added to each of driving stages SRC1 to SRCn. For instance, one of first and second voltage input terminals V1 and V2 may be omitted. In addition, a connection relation between driving stages SRC1 to SRCn may be changed.

Third driving stage SRC3 will be described in detail with reference to FIGS. 6 and 7 as a representative example, but the other driving stages may have substantially the same circuit diagram as that of third driving stage SRC3. For the convenience of explanation, FIG. 7 shows the waveforms of the input and output signals that are simplified. That is, levels of the input and output signals shown in FIG. 7 may be different from levels of real signals, but they are not limited thereto or thereby.

For the convenience of explanation, the corresponding driving stage indicates third driving stage SRC3, the previous driving stage indicates second driving stage SRC2, the next driving stage indicates fourth driving stage SRC4, and the next driving stage of the next driving stage indicates fifth driving stage SRC5.

Figure 6:
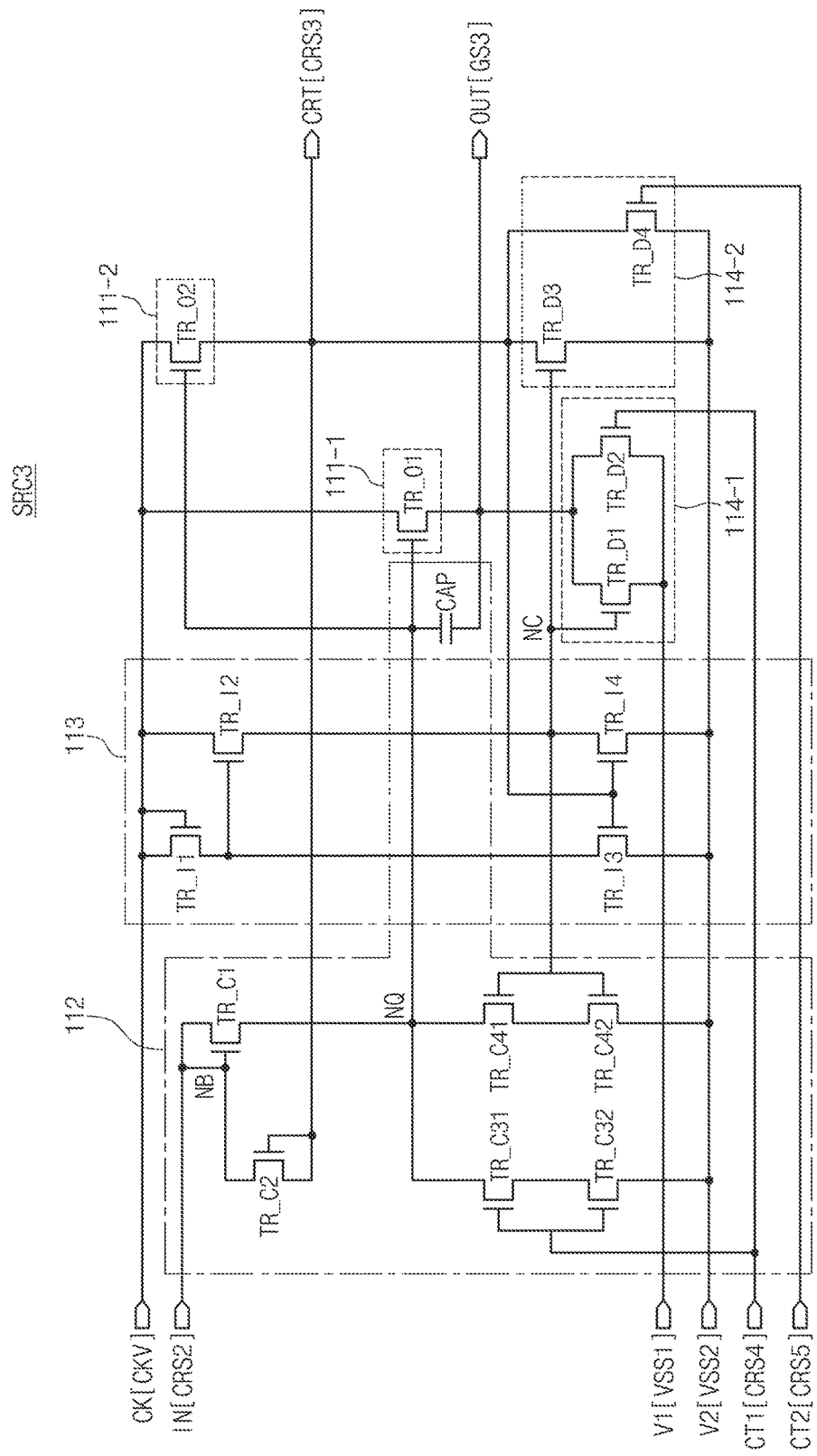
FIG. 6 is a circuit diagram showing a third driving stage of driving stages shown in FIG. 5.
Figure 7:
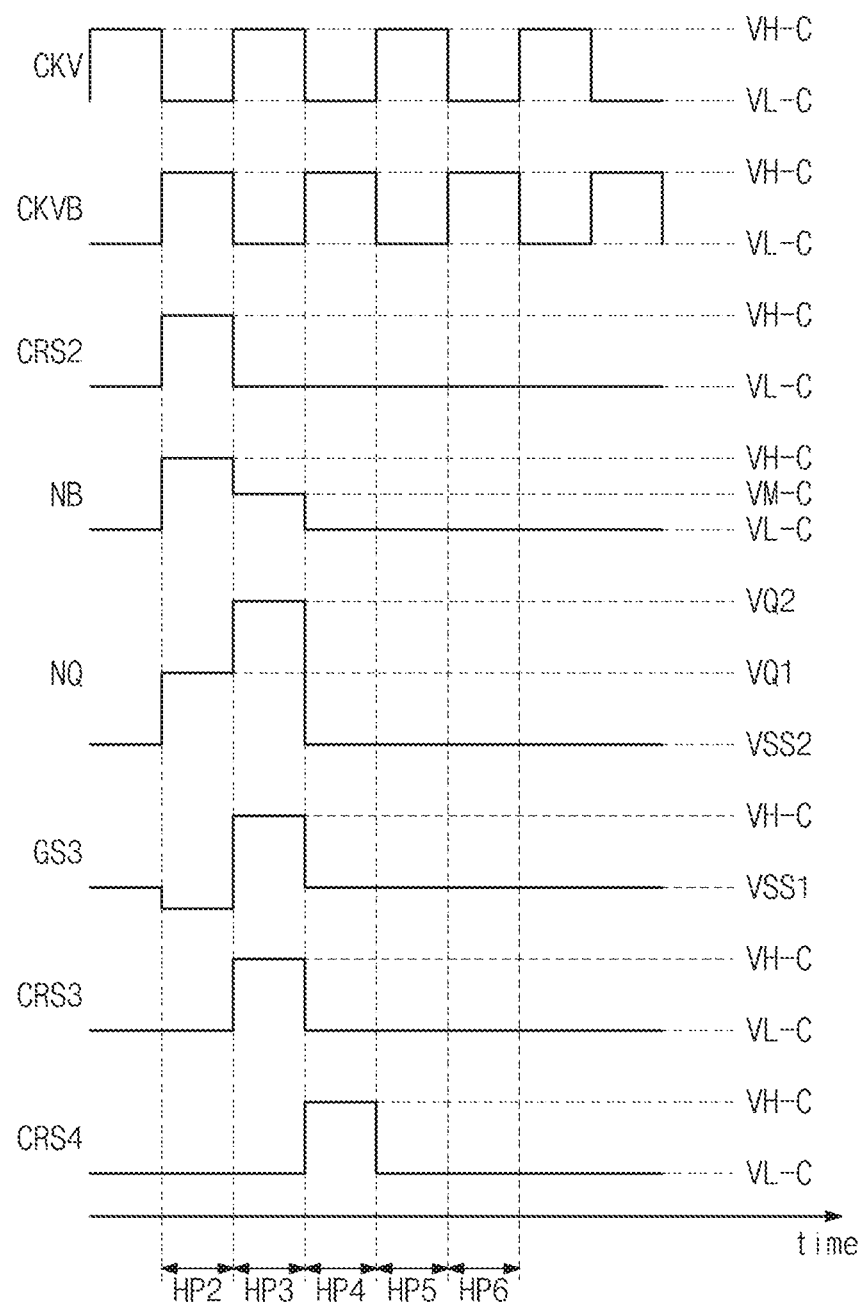
FIG. 7 is a waveform diagram showing input and output signals of the third driving stage shown in FIG. 6.

Referring to FIGS. 6 and 7, third driving stage SRC3 includes output components 111-1 and 111-2, control component 112, inverter component 113, and pull-down components 114-1 and 114-2. Output components 111-1 and 111-2 include first output component 111-1 outputting third gate signal GS3 and second output component 111-2 outputting third carry signal CRS3. Pull-down parts 114-1 and 114-2 include first pull-down component 114-1 lowering the output terminal OUT and second output component 114-2 lowering carry terminal CRT. However, the circuit configuration of third driving stage SRC3 should not be limited to the above-mentioned configuration.

First output component 111-1 includes first output transistor TR_O1. First output transistor TR_O1 includes an input electrode applied with first clock signal CKV, a control electrode connected to first node NQ (or control node), and an output electrode outputting third gate signal GS3.

Second output component 111-2 includes second output transistor TR2_O2. Second output transistor TR_O2 includes an input electrode applied with first clock signal CKV, a control electrode connected to first node NQ, and an output electrode outputting third carry signal CRS3.

Control component 112 controls the operation of first and second output parts 111-1 and 111-2. Control component 112 receives second carry signal CRS2 output from second driving stage SRC2, i.e., the previous driving stage, through input terminal IN thereof. Control component 112 turns on first and second output parts 111-1 and 111-2 in response to second carry signal CRS2, provided through control terminal IN. Control component 112 turns off first and second output parts 111-1 and 111-2 in response to fourth carry signal CRS4, output from fourth driving stage SRC4, i.e., the next driving stage.

Control component 112 controls first and second output parts 111-1 and 111-2 in response to a switching signal output from inverter component 113 such that first and second output parts 111-1 and 111-2 are maintained in the turned-off state. Control component 112 prevents an off leakage current in response to third carry signal CRS3, output through carry terminal CRT.

Control component 112 includes first control transistor TR_C1, second control transistor TR_C2, third control transistors TR_C31 and TR_C32, fourth control transistors TR_C41 and TR_C42, and capacitor CAP. According to the exemplary embodiment shown in FIG. 6, two third control transistors TR_C31 and TR_C32 are connected to each other in series and two fourth control transistors TR_C41 and TR_C42 are connected to each other in series.

First control transistor TR_C1 includes a control electrode and an input electrode, which are commonly connected to second node NB (or input node), and an output electrode connected to first node NQ. According to the exemplary embodiment shown in FIG. 6, second node NB is connected to input terminal IN. First control transistor TR_C1 is diode-connected between second node NB and first node NQ such that a current path is formed between second node NB and first node NQ. First control transistor TR_C1 applies a signal from input terminal IN, i.e., second carry signal CRS2, to first node NQ. First node NQ has an electric potential increased by second carry signal CRS2 which is provided by first control transistor TR_C1. The electric potential of first node NQ is boosted again when third gate signal GS3 is output.

Second control transistor TR_C2 includes a control electrode and an input electrode, which are commonly connected to carry terminal CRT, and an output electrode connected to second node NB. That is, second control transistor TR_C2 is diode-connected between carry terminal CRT and second node NB such that a current path is formed between carry terminal CRT and second node NB. Second control transistor TR_C2 applies a signal from carry terminal CRT, i.e., third carry signal CRS3, to second node NB. Second node NB has an electric potential increased by a predetermined level due to a signal provided by second control transistor TR_C2. For example, the predetermined level may be lower than the electric potential of third carry signal CRS3 by a critical voltage of second control transistor TR_C2.

For instance, carry signal CRS3 maintains a high voltage during third horizontal period HP3 as shown in FIG. 7. Second control transistor TR_C2 applies third carry signal CRS3 to second node NB and the electric potential of second node NB increases to middle voltage VM-C.

As described above, when the electric potential of second node NB is increased by third carry signal CRS3 provided through second control transistor TR_C2, drain-source voltage VDS of first control transistor TR_C1 is lowered during third horizontal period HP3. Therefore, first control transistor TR_C1 may be prevented from burning and deteriorating and an off leakage current of second node NQ may be prevented during third horizontal period HP3.

Capacitor CAP is connected between the control electrode and the output electrode of first output transistor TR_O1 and provided between output terminal OUT and first node NQ.

Two third control transistors TR_C31 and TR_C32 are connected between second voltage input terminal V2 and first node NQ in series. Control electrodes of third control transistors TR_C31 and TR_C32 are commonly connected to first control terminal CT1. Third control transistors TR_C31 and TR_C32 apply second discharge voltage VSS2 to first node NQ in response to fourth carry signal CRS4 provided from first control terminal CT1.

Fourth control transistors TR_C41 and TR_C42 are connected between second voltage input terminal V2 and first node NQ in series. Control electrodes of fourth control transistors TR_C41 and TR_C42 are commonly connected to third node NC, i.e., an output node. Third node NC is connected to an output terminal of the inverter component 113. Fourth control transistors TR_C41 and TR_C42 may apply second discharge voltage VSS2 to first node NQ in response to the switching signal output from inverter component 113.

In other exemplary embodiments, one of third control transistors TR_C31 and TR_C32 may be omitted or one of fourth control transistors TR_C41 and TR_C42 may be omitted. In other exemplary embodiments, third control transistors TR_C31 and TR_C32 or fourth control transistors TR_C41 and TR_C42 may be connected to first voltage input terminal V1 rather than second voltage input terminal V2.

Referring to FIGS. 6 and 7, inverter component 113 outputs the switching signal of third node NC. Inverter component 113 includes first, second, third, and fourth inverter transistors TR_I1, TR_I2, TR_I3, and TR_I4. First inverter transistor TR_I1 includes an input electrode and a control electrode, which are commonly connected to clock terminal CK, and an output electrode connected to a control electrode of second inverter transistor TR_I2. Second inverter transistor TR_I2 includes an input electrode connected to clock terminal CK and an output electrode connected to third node NC.

Third inverter transistor TR_I3 includes an output electrode connected to the output electrode of first inverter transistor TR_I1, a control electrode connected to carry terminal CRT, and an input electrode connected to second voltage input terminal V2. Fourth inverter transistor TR_I4 includes an output electrode connected to third node NC, a control electrode connected to carry terminal CRT, and an input electrode connected to second voltage input terminal V2.

In the present exemplary embodiment, the control electrodes of third and fourth inverter transistors TR_I3 and TR_I4 may be connected to output terminal OUT and the output electrodes of third and fourth inverter transistors TR_I3 and TR_I4 may be connected to first voltage input terminal V1.

First pull-down component 114-1 includes first pull-down transistor TR_D1 and second pull-down transistor TR_D2. First pull-down transistor TR_D1 includes an input electrode connected to first voltage input terminal V1, a control electrode connected to third node NC, and an output electrode connected to output terminal OUT. Second pull-down transistor TR_D2 includes an input electrode connected to first voltage input terminal V1, a control electrode connected to the first control terminal CT1, and an output electrode connected to output terminal OUT. In the present exemplary embodiment, at least one of the input electrode of first pull-down transistor TR_D1 and the input electrode of second pull-down transistor TR_D2 may be connected to second voltage input terminal V2.

Second pull-down component 114-2 includes third pull-down transistor TR_D3 and fourth pull-down transistor TR_D4. Third pull-down transistor TR_D3 includes an input electrode connected to second voltage input terminal V2, a control electrode connected to third node NC, and an output electrode connected to carry terminal CRT. Fourth pull-down transistor TR_D4 includes an input electrode connected to second voltage input terminal V2, a control electrode connected to second control terminal CT2, and an output electrode connected to carry terminal CRT. In exemplary embodiments, at least one of the input electrode of third pull-down transistor TR_D3 and the input electrode of fourth pull-down transistor TR_D4 may be connected to first voltage input terminal V1.

Hereinafter, the operation of third driving stage SRC3 will be described in detail with reference to FIGS. 6 and 7. As shown in FIG. 7, first and second clock signals CKV and CKVB have opposite phases. That is, first and second clock signals CKV and CKVB have a phase difference of about 180 degrees. Each of first and second clock signals CKV and CKVB includes low periods VL-C (hereinafter, referred to as a low voltage) having a relatively low level, and high period VH-C (hereinafter, referred to as a high voltage) having a relatively high level. The low periods are alternately arranged with the high periods in each of first and second clock signals CKV and CKVB. High voltage VH-C may be about 10 volts and low voltage VL-C may be about −16 volts. Low voltage VL-C may have substantially the same level as that of second discharge voltage VSS2 (refer to FIG. 5).

Third gate signal GS3 may include low period VL-G (hereinafter, referred to as a low voltage) having a relatively low level and high period VH-G (hereinafter, referred to as a high voltage) having a relatively high level. Low voltage VL-G of third gate signal GS3 may have substantially the same level as that of first discharge voltage VSS1 (refer to FIG. 5). Low voltage VL-G may be about −13 volts. Third gate signal GS3 may have substantially the same level as low voltage VL-C of first clock signal CKV during portions of periods. High voltage VH-G of third gate signal GS3 may have substantially the same level as high voltage VH-C of first clock signal CKV.

Third carry signal CRS3 includes a low period having a relatively low voltage level and a high period having a relatively high voltage level. Third carry signal CRS3 has low voltage VL-C and high voltage VH-C in different periods from each other. Since third carry signal CRS3 is generated on the basis of first clock signal CKV, third carry signal CRS3 has the same or similar voltage level as that of first clock signal CKV.

Second to seventh horizontal periods HP2 to HP7 shown in FIG. 7 indicate periods in which second to seventh gate signals GS2 to GS7 are output from the second to seventh driving stages SRC2 to SRC7, respectively.

As shown in FIG. 7, second carry signal CRS2 output from second driving stage SRC2 during second horizontal period HP2 has high voltage VH-C. In this case, first control transistor TR_C1 precharges first node NQ to first voltage VQ1 in response to second carry signal CRS2. During second horizontal period HP2, the second gate signal is output from second driving stage SRC2 at high voltage VH-C.

First and second output transistors TR_O1 and TR_O2 are turned on by first node NQ precharged with first voltage VQ1 during second horizontal period HP2. Then, when first clock signal CKV becomes high voltage VH-C during third horizontal period HP3, third gate signal GS3 is applied to capacitor CAP through first output transistor TR_O1. Thus, first node NQ rises to second voltage VQ2. The levels of third carry signal CRS3 and third gate signal GS3 respectively rise to high voltages VH-C and VH-G by first clock signal CKV having high voltage VH-C during third horizontal period HP3.

During third horizontal period HP3, second control transistor TR_C2 forms the current path between carry terminal CRT and second node NB. That is, when third carry signal CRS3 rises to high voltage VH-C, the level of second node NB rises. In this case, the risen level of second carry signal CRS2 may be lower than high voltage VH-C of third carry signal CRS3.

Then, fourth carry signal CRS4 of fourth driving stage SRC4, which is provided through first control terminal CT1, increases to high voltage VH-C during fourth horizontal period HP4 and first clock signal CKV decreases to low voltage VL-C during fourth horizontal period HP4. In this case, third control transistors TR_C31 and TR_C32 and second pull-down transistor TR_D2 are turned on in response to fourth carry signal CRS4, and fourth control transistors TR_C41 and TR_C42, first pull-down transistor TR_D1, and third pull-down transistor TR_D3 are turned on in response to the switching signal of third node NC, which is provided by inverter component 113. Third gate signal GS3 of output terminal OUT and third carry signal CRS3 of third carry terminal CRT are respectively lowered to low voltages VL-G and VL-C due to the turned-on transistors.

Similar to the above, third carry signal CRS3 is increased by a predetermined level by fourth carry signal CRS4 of fourth driving stage SRC4. During fifth to seventh horizontal periods HP5 to HP7, fifth to seventh driving stages SRC5 to SRC7 are operated in the similar way described above.

Figure 8:
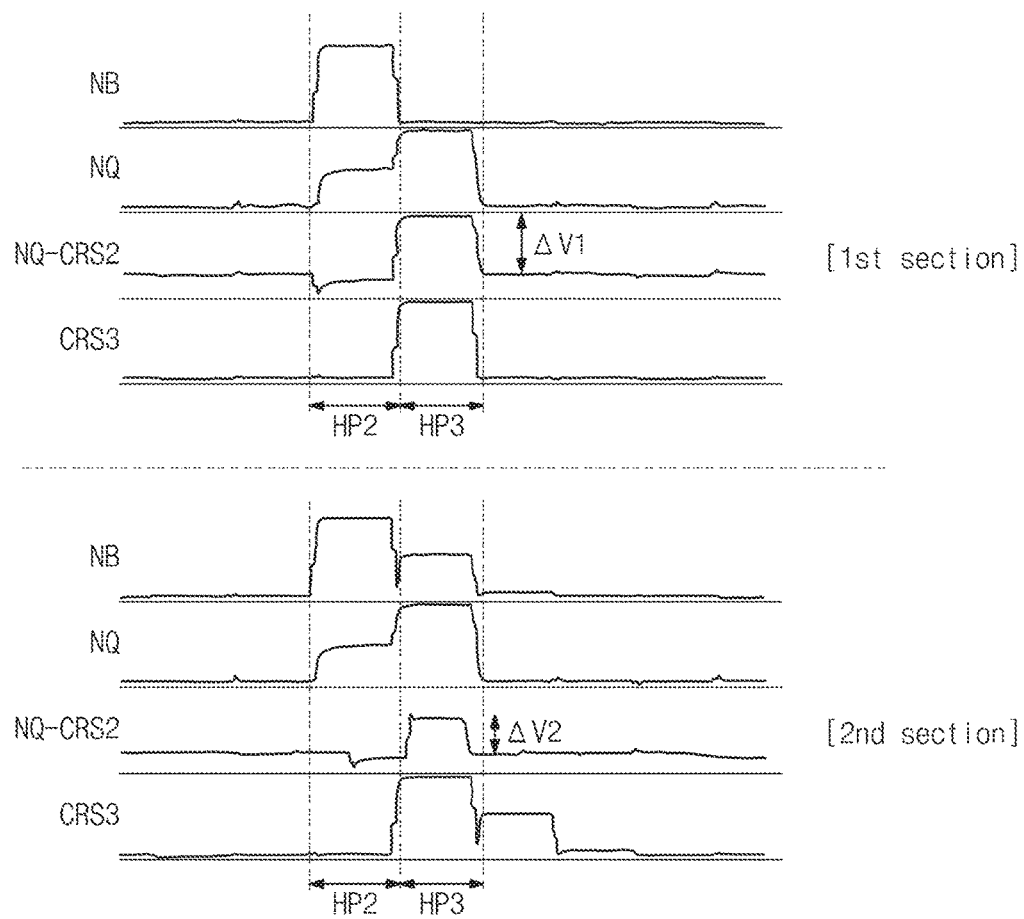
FIG. 8 is a simulated graph showing an effect of the gate driving circuit according to an exemplary embodiment of the present disclosure.

In FIG. 8, an X-axis indicates time and a Y-axis indicated voltage. In FIG. 8, 1st section is a graph to show the voltage of first node NQ, the voltage of second node NB, and the difference in voltage between first and second nodes NQ and NB in a conventional gate driving circuit. 2nd section is a graph showing the voltage of first node NQ, the voltage of second node NB, and the difference in voltage between the first and second nodes NQ and NB in the gate driving circuit according to an exemplary embodiment.

According to the first section (1st section), the voltage of first node NQ is charged with second voltage VQ2 during third horizontal period HP3 and second carry signal CRS2 is lowered to low voltage VL-C during third horizontal period HP3. In this case, difference in voltage NQ-CRS2, i.e., a drain-source voltage of first control transistor TR_C1, has first voltage difference ΔV1 during third horizontal period HP3.

According to the second section (2nd section), voltage of the first node NQ is charged with second voltage VQ2 during third horizontal period HP3 and second carry signal CRS2 is lowered to low voltage VL-C during third horizontal period HP3. As described with reference to FIGS. 6 and 7, since third carry signal crs3 increases to high voltage VH-C during third horizontal period HP3, the voltage of second node NB may increase by a predetermined level. In this case, difference in voltage NQ-CRS2, i.e., the drain-source voltage of first control transistor TR_C1, has a second voltage difference ΔV2 during third horizontal period HP3.

As shown in FIG. 8, second voltage difference ΔV2 is smaller than first voltage difference ΔV1. That is, according to the present exemplary embodiment, the drain-source voltage difference of first control transistor TR_C1 becomes low, and thus first control transistor TR_C1 is prevented from burning and deteriorating. Therefore, a reliability of the gate driving circuit may be improved.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A gate driving circuit, comprising:
   a first driving stage and a second driving stage, which respectively drive first and second gate lines of a display panel, the first driving stage comprising:
   a first output transistor comprising:
   a control electrode electrically connected to a control node;
   an input electrode configured to receive a clock signal; and
   an output electrode configured to output a first gate signal based on the clock signal;
   a second output transistor comprising:
   a control electrode electrically connected to the control node;
   an input electrode configured to receive the clock signal; and
   an output electrode configured to output a first carry signal based on the clock signal;
   a first control transistor configured to control an electric potential of the control node in response to a signal provided from the second driving stage through an input terminal of the first driving stage before the first gate signal is output; and a second control transistor configured to apply the first carry signal to an input electrode of the first control transistor when the first gate signal is output.

2. The gate driving circuit of claim 1, wherein the signal provided from the second driving stage is a second carry signal of the second driving stage.

3. The gate driving circuit of claim 2, wherein:
the output electrode of the first control transistor is electrically connected to the control node; and
the input electrode and the control electrode of the first control transistor are commonly electrically connected to the input terminal.

4. The gate driving circuit of claim 3, wherein:
an output electrode of the second control transistor is electrically connected to the input electrode of the first control transistor; and
the input electrode and of the second control transistor a control electrode of the second control transistor are configured to commonly receive the first carry signal.

5. The gate driving circuit of claim 1, further comprising third and fourth driving stages that respectively drive third and fourth gate lines of the display panel, wherein the first driving stage comprises:
an inverter component configured to receive the clock signal and apply a switching signal to an output node in response to the clock signal;
a first pull-down component disposed between the output electrode of the first output transistor and a first voltage input terminal to apply a first discharge voltage to the output electrode of the first output transistor through the first voltage input terminal in response to the switching signal of the output node or a signal provided from the third driving stage through a first control terminal; and
a second pull-down component disposed between the output electrode of the second output transistor and a second voltage input terminal to apply a second discharge voltage to the output electrode of the second output transistor through the second voltage input terminal in response to the switching signal of the output node or a signal provided from the fourth driving stage through a second control terminal.

6. The gate driving circuit of claim 5, wherein the signal configured to be provided from the third driving stage is a third carry signal and the signal configured to be provided from the fourth driving stage is a fourth carry signal.

7. The gate driving circuit of claim 6, wherein the first carry signal is configured to be applied to an input terminal of the second driving stage, the second carry signal is configured to be applied to an input terminal of the third driving stage, and the third carry signal is configured to be applied to an input terminal of the fourth driving stage.

8. The gate driving circuit of claim 6, wherein:
the first pull-down component comprises a first pull-down transistor and a second pull-down transistor, wherein:
the first pull-down transistor comprises:
an input electrode electrically connected to the first voltage input terminal;
a control electrode electrically connected to the output node; and
an output electrode electrically connected to the output electrode of the first output transistor; and
the second pull-down transistor comprises:
an input electrode electrically connected to the first voltage input terminal;
a control electrode electrically connected to the first control terminal; and
an output electrode electrically connected to the output electrode of the first output transistor; and
the first pull-down transistor is configured to be operated in response to the switching signal; and
the second pull-down transistor is configured to be operated in response to the third carry signal.

9. The gate driving circuit of claim 6, wherein the second pull-down component comprises:
a first pull-down transistor and a second pull-down transistor, the first pull-down transistor comprising:
an input electrode electrically connected to the second voltage input terminal;
a control electrode electrically connected to the output node; and
an output electrode electrically connected to the output electrode of the second output transistor;
the second pull-down transistor comprising:
an input electrode electrically connected to the second voltage input terminal;
a control electrode electrically connected to the second control terminal; and
an output electrode electrically connected to the output electrode of the second output transistor, wherein:
the first pull-down transistor is configured to be operated in response to the switching signal; and
the second pull-down transistor is configured to be operated in response to the fourth carry signal.

10. The gate driving circuit of claim 6, wherein the first driving stage further comprises:
at least one third control transistor electrically connected between the control node and the second voltage input terminal and configured to apply the second discharge voltage to the control node in response to the third carry signal provided through the first control terminal; and
at least one fourth control transistor electrically connected between the control node and the second voltage input terminal configured to apply the second discharge voltage to the control node in response to the switching signal.

11. A gate driving circuit, comprising:
a first driving stage and a second driving stage, which respectively drive first and second gate lines of a display panel, the first driving stage comprising:
an output component configured to output a first gate signal and a first carry signal generated on a basis of a clock signal, in response to a voltage of a control node;
a control component configured to control the voltage of the control node on the basis of a second carry signal output from the second driving stage;
an inverter component configured to output a switching signal generated on the basis of the clock signal; and
a pull-down component configured to lower the first gate signal and the first carry signal, which are output from the output component, after the first gate signal is output, the control component comprising:
a first control transistor configured to control an electric potential of the control node in response to the second carry signal; and
a second control transistor configured to apply the second carry signal to an input electrode of the first control transistor in response to the first carry signal.

12. The gate driving circuit of claim 11, wherein:
the first control transistor comprises:
the output electrode electrically connected to the control node; and the input electrode and the control electrode configured to commonly receive the second carry signal, and
the second control transistor comprises:
the input electrode configured to receive the first carry signal; and
the input electrode and a control electrode commonly electrically connected to the input electrode of the first control transistor.

13. The gate driving circuit of claim 11, wherein the output component comprises:
a first output transistor comprising:
an input electrode configured to receive the clock signal;
a control electrode electrically connected to the control node; and
an output electrode configured to output the first gate signal; and
a second output transistor comprising:
an input electrode configured to receive the clock signal;
a control electrode electrically connected to the control node; and
an output electrode configured to output the first carry signal.

14. The gate driving circuit of claim 13, further comprising third and fourth driving stages that respectively drive third and fourth gate lines of the display panel, wherein the control component comprises:
at least one third control transistor electrically connected between the control node and a first voltage input terminal to apply a first discharge voltage to the control node in response to a third carry signal provided from the third driving stage through a first control terminal; and
at least one fourth control transistor electrically connected between the control node and the first voltage input terminal to apply a second discharge voltage to the control node in response to the switching signal.

15. The gate driving circuit of claim 14, wherein the pull-down component comprises:
a first pull-down component configured to lower the first gate signal in response to the switching signal or the third carry signal from the third driving stage; and
a second pull-down component configured to lower the first carry signal in response to the switching signal or a fourth carry signal from the third driving stage.

16. The gate driving circuit of claim 15, wherein:
the first pull-down component comprises:
a first pull-down transistor; and
a second pull-down transistor,
the first pull-down transistor comprises:
an input electrode electrically connected to a second voltage input terminal;
a control electrode configured to receive the switching signal; and
an output electrode electrically connected to the output electrode of the first output transistor, and
the second pull-down transistor comprises:
an input electrode electrically connected to the second voltage input terminal;
a control electrode configured to receive the third carry signal; and
an output electrode electrically connected to the output electrode of the first output transistor.

17. The gate driving circuit of claim 15, wherein:
the second pull-down component comprises:
a first pull-down transistor and a second pull-down transistor;
the first pull-down transistor comprises:
an input electrode electrically connected to a second voltage input terminal;
a control electrode configured to receive the switching signal; and
an output electrode electrically connected to the output electrode of the second output transistor, and
the second pull-down transistor comprises:
an input electrode electrically connected to the second voltage input terminal;
a control electrode configured to receive the fourth carry signal; and
an output electrode electrically connected to the output electrode of the second output transistor.

18. The gate driving circuit of claim 14, wherein the first carry signal is configured to be applied to an input terminal of the third driving stage and the third carry signal is configured to be applied to the fourth driving stage.

19. The gate driving circuit of claim 14, wherein the control component comprises:
at least one first control transistor electrically connected between the control node and the first voltage input terminal configured to apply the first discharge voltage to the control node in response to the third carry signal; and
at least one second control transistor electrically connected between the control node and the first voltage input terminal configured to apply the first discharge voltage to the control node in response to the switching signal.

20. A gate driving circuit, comprising:
an (i−1)-th (where i is a natural number equal to or greater than 2) driving stage and an i-th driving stage respectively configured to apply an (i−1)-th gate signal and an i-th gate signal to an (i−1)-th gate line and an i-th gate line, the i-th driving stage comprising:
a first output transistor comprising:
a control electrode electrically connected to a control node;
an input electrode configured to receive a clock signal; and
an output electrode configured to output the i-th gate signal;
a second output transistor comprising:
a control electrode electrically connected to the control node;
an input electrode configured to receive the clock signal; and
an output electrode configured to output an i-th carry signal;
a first control transistor configured to output an (i−1)th carry signal provided from the i-th driving stage to the control node; and
a second control transistor configured to output the i-th carry signal to the input electrode of the first control transistor.

* * * * *